(12) United States Patent
Sakurai

(10) Patent No.: US 7,577,215 B2
(45) Date of Patent: Aug. 18, 2009

(54) ANGLE DEMODULATION APPARATUS, LOCAL OSCILLATION APPARATUS, ANGLE DEMODULATION METHOD, LOCAL OSCILLATION SIGNAL GENERATING METHOD, RECORDING MEDIUM AND COMPUTER DATA SIGNAL

(75) Inventor: Kiyoshi Sakurai, Nara (JP)

(73) Assignee: Icom Incorporated, Osaka (JP)

( * ) Notice: Subject to any disclaimer, the term of this patent is extended or adjusted under 35 U.S.C. 154(b) by 755 days.

(21) Appl. No.: 11/202,819

(22) Filed: Aug. 12, 2005

(65) Prior Publication Data

US 2005/0272396 A1 Dec. 8, 2005

Related U.S. Application Data

(62) Division of application No. 09/819,382, filed on Mar. 28, 2001, now Pat. No. 6,947,499.

(30) Foreign Application Priority Data

Jul. 31, 2000 (JP) ............................. 2000-232024
Nov. 27, 2000 (JP) ............................. 2000-358845

(51) Int. Cl.
H03D 3/18 (2006.01)
H03D 3/24 (2006.01)

(52) U.S. Cl. ....................... 375/327; 375/376; 375/326; 375/325; 375/324; 455/316; 455/260; 455/255

(58) Field of Classification Search ................. 375/327, 375/376, 326, 325, 324; 455/315, 316, 164.2, 455/260, 262, 264, 265, 189.1

See application file for complete search history.

(56) References Cited

U.S. PATENT DOCUMENTS

| | | | |
|---|---|---|---|
| 4,551,856 A | 11/1985 | Victor et al. | |
| 4,944,025 A | 7/1990 | Gehring et al. | |
| 5,109,531 A | 4/1992 | Heck | |
| 5,179,729 A | 1/1993 | Mishima et al. | |
| 5,311,318 A | 5/1994 | Dobrovolny | |
| 5,548,243 A * | 8/1996 | Sun et al. | 329/316 |
| 5,606,731 A | 2/1997 | Pace et al. | |
| 5,761,615 A * | 6/1998 | Jaffee | 455/314 |
| 5,809,090 A * | 9/1998 | Buternowsky et al. | 375/347 |
| 5,847,612 A | 12/1998 | Birleson | |
| 6,023,491 A * | 2/2000 | Saka et al. | 375/326 |
| 6,154,640 A * | 11/2000 | Itoh et al. | 455/76 |
| 6,411,660 B1 | 6/2002 | Oh | |
| 6,519,305 B1 | 2/2003 | Roth et al. | |

FOREIGN PATENT DOCUMENTS

DE 29 05 331 A1 8/1980

* cited by examiner

*Primary Examiner*—Phuong Phu
(74) *Attorney, Agent, or Firm*—Frishauf, Holtz, Goodman & Chick, P.C.

(57) ABSTRACT

An FM modulation signal is mixed with a pair of first local oscillation signals to be converted to a pair of base band signals. The base band signals are respectively mixed a pair of second local oscillation signals. The resultant signals are added together, thereby yielding an IF signal which is in turn detected. The local oscillator generates a reference oscillation signal whose frequency corresponds to a carrier component of the IF signal and frequency-divides the reference oscillation signal, thus generating the second local oscillation signals. The frequency of the first local oscillation signal converges to the one that has a given ratio to the frequency of the reference oscillation signal.

8 Claims, 5 Drawing Sheets

ANGLE DEMODULATION APPARATUS, LOCAL OSCILLATION APPARATUS, ANGLE DEMODULATION METHOD, LOCAL OSCILLATION SIGNAL GENERATING METHOD, RECORDING MEDIUM AND COMPUTER DATA SIGNAL

CROSS-REFERENCE TO RELATED APPLICATION

The present application is a Divisional application of U.S. application Ser. No. 09/819,382 filed Mar. 28, 2001 now U.S. Pat. No. 6,947,499.

BACKGROUND OF THE INVENTION

1. Field of the Invention

The present invention relates to an angle demodulation apparatus and angle demodulation method.

2. Description of the Related Art

Direct conversion is known as a scheme of demodulating an FM (Frequency Modulation) modulation signal. An FM receiver which uses the direct conversion scheme has a structure as shown in, for example, FIG. 5.

In the FM receiver shown in FIG. 5, an FM modulation signal is received by an antenna 301 and is amplified by an RF (Radio Frequency) amplifier 302. A branching filter 303 sends the amplified FM modulation signal to first mixers 304I and 304Q. The FM modulation signal is mixed with a pair of first local oscillation signals having a phase difference of 90 degrees to be converted to a pair of base band signals. The first local oscillation signals are generated by a first local oscillator 314 and a first phase shifter 308. Note that the frequencies of the first local oscillation signals are set to the same frequency as the frequency of the carrier frequency of the received signal.

The base band signals have their harmonic components cut off by LPFs (Low Pass Filters) 305I and 305Q and are then amplified by amplifiers 306I and 306Q. The amplified base band signals are respectively mixed with a pair of second local oscillation signals having a phase difference of 90 degrees by second mixers 307I and 307Q. The second local oscillation signals are generated by a second local oscillator 315 and a second phase shifter 309. The mixing-originated signals are added together by an adder 310, thereby yielding a single intermediate frequency signal.

The intermediate frequency signal is supplied to an FM detector 313 via a BPF (Band Pass Filter) 311 and IF (Intermediate Frequency) amplifier 312. The FM detector 313 detects the intermediate frequency signal and outputs an audio signal originated from the detection.

The direct conversion scheme can simplify the structure of the apparatus that demodulates an FM modulation signal. Unlike superheterodyne, the direct conversion scheme does not suffer interference by signals whose frequencies lie in the vicinity of the image frequency.

When the first mixers cause the secondary distortion of the disturbance or the secondary distortion of the first local oscillation signals in the FM receiver with the above-described structure shown in FIG. 5, however, the DC component that is contained in the secondary distortion is mixed with the base band signals. When the DC component mixed in each base band signal is removed by an HPF (High Pass Filter), the carrier component of the FM modulation signal converted to that base band signal is eliminated too. This results in inaccurate demodulation of an FM modulation signal.

A possible scheme of eliminating the DC component without sacrificing the precise demodulation of the FM modulation signal is disclosed in, for example, U.S. Pat. No. 4,944,025.

The scheme taught by U.S. Pat. No. 4,944,025 allows the first local oscillator to implement AFC (Automatic Frequency Control) using the voltage that is acquired by adding an offset voltage to a voltage obtained by detecting the intermediate frequency signal. This scheme can make the frequency of the first local oscillation signal offset by a predetermined amount from the carrier frequency of an FM modulation signal which is to be received. It is therefore possible to easily eliminate the DC component from the base band signal using an HPF without sacrificing the precision.

However, the scheme makes it difficult to adjust the circuit that adds the offset voltage to a voltage obtained by detecting the intermediate frequency signal. Further, the offset amount of frequency becomes unstable. Because the first and second local oscillators that independently generate signals of different frequencies, the operation of the FM receiver is likely to become unstable. What is more, the structure of the FM receiver is complicated or large, thus resulting in a cost increase.

SUMMARY OF THE INVENTION

Accordingly, it is an object of the present invention to provide an angle demodulation apparatus and angle demodulation method which execute a direct conversion scheme with a simple structure and are easy to adjust.

It is another object of the invention to provide an angle demodulation apparatus and angle demodulation method which generate local oscillation signals based on a single reference oscillation signal and employ a direct conversion scheme.

It is a further object of the invention to provide a local oscillation apparatus and local oscillation generating method which generate local oscillation signals based on a single reference oscillation signal and employ a direct conversion scheme.

It is a still further object of the invention to provide an angle demodulation apparatus and angle demodulation method which generate local oscillation signals with stable frequencies and execute stable demodulation using a direct conversion scheme.

To achieve the above objects, an angle demodulation apparatus according to the first aspect of the invention comprises:

a first oscillator for generating a first local oscillation signal and a first phase signal whose phase differs from that of the first local oscillation signal substantially by 90 degrees;

a first mixer for externally receiving an angle modulation signal, receiving the first local oscillation signal and the first phase signal from the first oscillator, generating a first base band signal comprised of that of a product of an instantaneous value of the angle modulation signal and an instantaneous value of the first local oscillation signal from which a component with a frequency of substantially 0 is removed, and generating a second base band signal comprised of that of a product of the instantaneous value of the angle modulation signal and an instantaneous value of the first phase signal from which a component with a frequency of substantially 0 is removed;

a second oscillator for generating a second local oscillation signal and a second phase signal whose phase differs from that of the second local oscillation signal substantially by 90 degrees;

a second mixer for receiving the first and second base band signals from the first mixer, receiving the second local oscillation signal and the second phase signal from the second oscillator, and generating an intermediate frequency signal representing a sum of or a difference between a product of an instantaneous value of the first base band signal and an instantaneous value of the second local oscillation signal and a product of an instantaneous value of the second base band signal and an instantaneous value of the second phase signal; and a demodulator for receiving the intermediate frequency signal from the second mixer and demodulating the intermediate frequency signal to thereby generate an angle demodulation signal, the second oscillator including a reference oscillator for generating a reference oscillation signal, and a frequency divider for generating the second local oscillation signal whose frequency is substantially equal to a difference between or a sum of a predetermined intermediate frequency signal and an offset frequency of a predetermined range by frequency-dividing the reference oscillation signal by a predetermined first frequency dividing ratio, the first oscillator including a variable frequency oscillator for receiving the reference oscillation signal and generating the first local oscillation signal whose frequency is substantially equal to a sum of or a difference between a carrier frequency of the angle modulation signal and the offset frequency by generating a signal whose frequency converges to a frequency having a given ratio to a frequency of the received reference oscillation signal.

This angle demodulation apparatus demodulates an angle modulation signal using a direct conversion scheme. Both of the first and second local oscillation signals are generated based on the single reference oscillation signal. This makes the structure simpler and adjustment easier. This feature stabilizes the frequency of each local oscillation signal, thus making the demodulation operation stable.

According to the second aspect of the invention, there is provided a local oscillation apparatus which supplies a frequency converting apparatus for generating a base band signal based on a first local oscillation signal and an angle modulation signal and generating an intermediate frequency signal based on a second local oscillation signal and the base band signal, with the first and second local oscillation signals, and which comprises:

a reference oscillator for generating a reference oscillation signal;

a frequency divider for generating the second local oscillation signal whose frequency is substantially equal to a difference between or a sum of a predetermined intermediate frequency signal and an offset frequency of a predetermined range by frequency-dividing the reference oscillation signal by a predetermined first frequency dividing ratio; and a variable frequency oscillator for receiving the reference oscillation signal and generating the first local oscillation signal whose frequency is substantially equal to a sum of or a difference between a carrier frequency of the angle modulation signal and the offset frequency by generating a signal whose frequency converges to a frequency having a given ratio to a frequency of the received reference oscillation signal.

This local oscillation apparatus generates both of the first and second local oscillation signals based on the single reference oscillation signal. This makes the structure simpler and adjustment easier. Further, the frequency of each local oscillation signal becomes stable.

In the angle demodulation apparatus or the local oscillation apparatus, the reference oscillator may have a frequency control circuit for receiving the intermediate frequency signal and generating the reference oscillation signal whose frequency is the frequency of the second local oscillation signal multiplied by the first frequency dividing ratio by generating a signal whose frequency converges to a frequency having a given ratio to a carrier frequency of the received intermediate frequency signal.

This structure allows the frequency of the reference oscillation signal to converge to the value that is the difference between the intermediate frequency signal and the offset frequency multiplied by the first frequency dividing ratio. The modified angle demodulation apparatus or local oscillation apparatus therefore becomes easier to adjust.

The frequency control circuit may have a first PLL (Phase-Locked Loop) control circuit for determining the frequency of the reference oscillation signal, based on a phase difference between a carrier component of the received intermediate frequency signal and a signal acquired by frequency-dividing the reference oscillation signal by a predetermined second frequency dividing ratio, in such a way that the frequency of the reference oscillation signal converges to a value having a given ratio to a frequency of the carrier component, and generating the reference oscillation signal having the determined frequency. This structure allows the frequency of the reference oscillation signal to converge to the value that is the sum of the intermediate frequency signal and the offset frequency multiplied by the first frequency dividing ratio.

The variable frequency oscillator may have a second PLL (Phase-Locked Loop) control circuit for determining the frequency of the first local oscillation signal, based on a phase difference between a signal acquired by frequency-dividing the received reference oscillation signal by a predetermined third frequency dividing ratio and a signal acquired by frequency-dividing the first local oscillation signal by a predetermined fourth frequency dividing ratio, in such a way that the frequency of the first local oscillation signal converges to a value having a given ratio to the frequency of the reference oscillation signal, and generating the first local oscillation signal having the determined frequency. This structure allows the frequency of the first local oscillation signal to converge to the value that is the sum of the carrier frequency of the angle modulation signal and the offset frequency.

It is desirable that the offset frequency for the angle demodulation apparatus should lie within a range of 300 Hz. In the case of reproducing an audio signal, even if the component of the audio signal which has a frequency of about 300 Hz or lower is eliminated, the precision of a speech to be reproduced is not deteriorated. Therefore, the DC component of the secondary distortion caused by a mixer is removed easily without impairing accurate demodulation by eliminating the component of the audio signal whose frequency is lower than the offset frequency from the base band signal using an HPF or a capacitor.

As long as the offset frequency lies within a range of 300 Hz in the case of the local oscillation apparatus, therefore, the DC component of the secondary distortion, if contained in the base band signal that is generated by the frequency converting apparatus, is eliminated easily.

The first oscillator may have means for changing the ratio of the value to which the frequency of the first local oscillation signal converges to the frequency of the reference oscillation signal in accordance with manipulation by an operator. In this case, the carrier frequency of the angle modulation signal to be demodulated or subjected to frequency conversion can be made variable.

An angle demodulation apparatus according to the third aspect of the invention comprises:

a first oscillation section for generating a first local oscillation signal and a first phase signal whose phase differs from that of the first local oscillation signal substantially by 90 degrees;

a first mixing section for externally receiving an angle modulation signal, receiving the first local oscillation signal and the first phase signal from the first oscillation section, generating a first base band signal comprised of that of a product of an instantaneous value of the angle modulation signal and an instantaneous value of the first local oscillation signal from which a component with a frequency of substantially 0 is removed, and generating a second base band signal comprised of that of a product of the instantaneous value of the angle modulation signal and an instantaneous value of the first phase signal from which a component with a frequency of substantially 0 is removed;

a second oscillation section for generating a second local oscillation signal whose frequency is substantially equal to a difference between or a sum of a predetermined intermediate frequency signal and an offset frequency of a predetermined range and a second phase signal whose phase differs from that of the second local oscillation signal substantially by 90 degrees;

a second mixing section for receiving the first and second base band signals from the first mixing section, receiving the second local oscillation signal and the second phase signal from the second oscillation section, and generating an intermediate frequency signal representing a sum of or a difference between a product of an instantaneous value of the first base band signal and an instantaneous value of the second local oscillation signal and a product of an instantaneous value of the second base band signal and an instantaneous value of the second phase signal; and a demodulation section for receiving the intermediate frequency signal from the second mixing section and demodulating the intermediate frequency signal to thereby generate an angle demodulation signal, whereby the first oscillator generates the first local oscillation signal whose frequency is substantially equal to a sum of or a difference between a carrier frequency of the angle modulation signal and the offset frequency by receiving the first base band signal or the second base band signal from the first mixing section, extracting a carrier component of the angle modulation signal included in the received first base band signal or second base band signal and generating a signal whose frequency converges to a frequency having a given ratio to a frequency of the extracted carrier component.

This angle demodulation apparatus demodulates an angle modulation signal using a direct conversion scheme. The first local oscillation signal is generated based on the carrier component of the angle modulation signal that is extracted from the first base band signal or the second base band signal. This stabilizes the frequency of the first local oscillation signal. Therefore, the demodulation operation of the angle demodulation apparatus becomes stable. Further, the angle demodulation apparatus has a simple structure and is easy to adjust.

More specifically, the first oscillation section may include:

a third mixing section for receiving the first base band signal or the second base band signal from the first mixing section, receiving the second local oscillation signal from the second oscillation section, and generating a signal representing a product of an instantaneous value of the carrier component of the angle modulation signal included in the received first base band signal or second base band signal and the instantaneous value of the second local oscillation signal;

a carrier-component extracting section for extracting, from the signal generated by the third mixing section, the carrier component whose frequency is equivalent to a sum of or a difference between the carrier frequency of the angle modulation signal and the frequency of the second local oscillation signal; and a variable frequency oscillator for generating the first local oscillation signal whose frequency is substantially equal to the sum of or the difference between the carrier frequency of the angle modulation signal and the offset frequency by generating a signal whose frequency converges to a frequency having a given ratio to the frequency of the carrier component extracted by the carrier-component extracting section.

The variable frequency oscillator may be designed to have a PLL (Phase-Locked Loop) control section for determining the frequency of the first local oscillation signal, based on a phase difference between a signal acquired by frequency-dividing the carrier component, extracted by the carrier-component extracting section, by a predetermined first frequency dividing ratio and a signal acquired by frequency-dividing the first local oscillation signal by a predetermined second frequency dividing ratio, in such a way that the frequency of the first local oscillation signal converges to a value having a given ratio to the frequency of the carrier component extracted by the carrier-component extracting section, and generating the first local oscillation signal having the determined frequency. This structure easily generates the first local oscillation signal whose frequency is accurate and stable.

The first oscillation section may include:

a carrier-component extracting section for receiving the first base band signal or the second base band signal from the first mixing section and extracting the carrier component of the angle modulation signal from the received first base band signal or second base band signal;

a third mixing section for receiving the second local oscillation signal from the second oscillation section, generating a signal representing a product of an instantaneous value of the carrier component extracted by the carrier-component extracting section and the instantaneous value of the second local oscillation signal, and extracting, from that generated signal, a component whose frequency is equivalent to a sum of or a difference between the carrier frequency of the angle modulation signal and the frequency of the second local oscillation signal; and a variable frequency oscillator for generating the first local oscillation signal whose frequency is substantially equal to the sum of or the difference between the carrier frequency of the angle modulation signal and the offset frequency by generating a signal whose frequency converges to a frequency having a given ratio to the frequency of the component extracted by the third mixing section.

In this case, the variable frequency oscillator may have a PLL (Phase-Locked Loop) control section for determining the frequency of the first local oscillation signal, based on a phase difference between a signal acquired by frequency-dividing the carrier component, extracted by the third mixing section, by a predetermined first frequency dividing ratio and a signal acquired by frequency-dividing the first local oscillation signal by a predetermined second frequency dividing ratio, in such a way that the frequency of the first local oscillation signal converges to a value having a given ratio to the frequency of the carrier component extracted by the carrier-component extracting section, and generating the first local oscillation signal having the determined frequency. This structure easily generates the first local oscillation signal whose frequency is accurate and stable.

It is desirable that the offset frequency for the angle demodulation apparatus should lie within a range of 300 Hz. In the case of reproducing an audio signal, even if the component of the audio signal which has a frequency of about 300 Hz or lower is eliminated, the precision of a speech to be reproduced is not deteriorated. Therefore, the DC component of the secondary distortion caused by a mixing section is removed easily without impairing accurate demodulation by eliminating the component of the audio signal whose frequency is lower than the offset frequency from the base band signal using an HPF or a capacitor.

An angle demodulation method according to the fourth aspect of the invention comprises the steps of:

generating a first local oscillation signal and a first phase signal whose phase differs from that of the first local oscillation signal substantially by 90 degrees;

externally receiving an angle modulation signal, generating a first base band signal comprised of that of a product of an instantaneous value of the angle modulation signal and an instantaneous value of the first local oscillation signal from which a component with a frequency of substantially 0 is removed, and generating a second base band signal comprised of that of a product of the instantaneous value of the angle modulation signal and an instantaneous value of the first phase signal from which a component with a frequency of substantially 0 is removed;

generating a second local oscillation signal and a second phase signal whose phase differs from that of the second local oscillation signal substantially by 90 degrees;

generating an intermediate frequency signal representing a sum of or a difference between a product of an instantaneous value of the first base band signal and an instantaneous value of the second local oscillation signal and a product of an instantaneous value of the second base band signal and an instantaneous value of the second phase signal; and generating an angle demodulation signal by detecting the intermediate frequency signal, whereby the second local oscillation signal has a frequency substantially equal to a difference between or a sum of a predetermined intermediate frequency signal and an offset frequency of a predetermined range and is generated by frequency-dividing a reference oscillation signal by a predetermined first frequency dividing ratio, and the first local oscillation signal has a frequency substantially equal to a sum of or a difference between a carrier frequency of the angle modulation signal and the offset frequency and is generated by generating a signal whose frequency converges to a frequency having a given ratio to a frequency of the received reference oscillation signal.

This angle demodulation method demodulates an angle modulation signal using a direct conversion scheme. Both of the first and second local oscillation signals are generated based on the single reference oscillation signal. The method therefore has a simple structure and is easy to adjust. Further, the frequency of each local oscillation signal becomes stable, thus stabilizing the demodulation operation.

According to the fifth aspect of the invention, there is provided a local oscillation signal generating method which supplies a frequency converting apparatus for generating a base band signal based on a first local oscillation signal and an angle modulation signal and generating an intermediate frequency signal based on a second local oscillation signal and the base band signal, with the first and second local oscillation signals, and comprises the steps of:

generating a reference oscillation signal;

generating the second local oscillation signal whose frequency is substantially equal to a difference between or a sum of a predetermined intermediate frequency signal and an offset frequency of a predetermined range by frequency-dividing the reference oscillation signal by a predetermined first frequency dividing ratio; and generating the first local oscillation signal whose frequency is substantially equal to a sum of or a difference between a carrier frequency of the angle modulation signal and the offset frequency by generating a signal whose frequency converges to a frequency having a given ratio to a frequency of the received reference oscillation signal.

This local oscillation generating method also generates both of the first and second local oscillation signals based on the single reference oscillation signal. The method therefore has a simple structure and is easy to adjust. Further, the frequency of each local oscillation signal becomes stable.

An angle demodulation method according to the sixth aspect of the invention comprises the steps of:

generating a first local oscillation signal and a first phase signal whose phase differs from that of the first local oscillation signal substantially by 90 degrees;

externally receiving an angle modulation signal, generating a first base band signal comprised of that of a product of an instantaneous value of the angle modulation signal and an instantaneous value of the first local oscillation signal from which a component with a frequency of substantially 0 is removed, and generating a second base band signal comprised of that of a product of the instantaneous value of the angle modulation signal and an instantaneous value of the first phase signal from which a component with a frequency of substantially 0 is removed;

generating a second local oscillation signal whose frequency is substantially equal to a difference between or a sum of a predetermined intermediate frequency signal and an offset frequency of a predetermined range and a second phase signal whose phase differs from that of the second local oscillation signal substantially by 90 degrees;

generating an intermediate frequency signal representing a sum of or a difference between a product of an instantaneous value of the first base band signal and an instantaneous value of the second local oscillation signal and a product of an instantaneous value of the second base band signal and an instantaneous value of the second phase signal; and generating an angle demodulation signal by detecting the intermediate frequency signal, whereby the first oscillator has a frequency substantially equal to a sum of or a difference between a carrier frequency of the angle modulation signal and the offset frequency and is generated by extracting a carrier component of the angle modulation signal included in the received first base band signal or second base band signal and generating a signal whose frequency converges to a frequency having a given ratio to a frequency of the extracted carrier component.

This angle demodulation method demodulates an angle modulation signal using a direct conversion scheme. The first local oscillation signal is generated based on the carrier component of the angle modulation signal that is extracted from the first base band signal or the second base band signal. This stabilizes the frequency of the first local oscillation signal, thus making the demodulation operation by the angle demodulation method stable. Further, the angle demodulation method has a simple structure and is easy to adjust.

A computer readable recording medium according to the seventh aspect of the invention, which has recorded a program for allowing a computer to function as:

a first oscillator for generating a first local oscillation signal and a first phase signal whose phase differs from that of the first local oscillation signal substantially by 90 degrees, a first mixer for externally receiving an angle modulation signal, receiving the first local oscillation signal and the first phase signal from the first oscillator, generating a first base band signal comprised of that of a product of an instantaneous value of the angle modulation signal and an instantaneous value of the first local oscillation signal from which a component with a frequency of substantially 0 is removed, and generating a second base band signal comprised of that of a product of the instantaneous value of the angle modulation signal and an instantaneous value of the first phase signal from which a component with a frequency of substantially 0 is removed, a second oscillator for generating a second local oscillation signal and a second phase signal whose phase differs from that of the second local oscillation signal substantially by 90 degrees, a second mixer for receiving the first and second base band signals from the first mixer, receiving the second local oscillation signal and the second phase signal from the second oscillator, and generating an intermediate frequency signal representing a sum of or a difference between a product of an instantaneous value of the first base band signal and an instantaneous value of the second local oscillation signal and a product of an instantaneous value of the second base band signal and an instantaneous value of the second phase signal, and a demodulator for receiving the intermediate frequency signal from the second mixer and demodulating the intermediate frequency signal to thereby generate an angle demodulation signal;

for allowing the second oscillator to function as a reference oscillator for generating a reference oscillation signal, and a frequency divider for generating the second local oscillation signal whose frequency is substantially equal to a difference between or a sum of a predetermined intermediate frequency signal and an offset frequency of a predetermined range by frequency-dividing the reference oscillation signal by a predetermined first frequency dividing ratio; and for allowing the first oscillator to function as a variable frequency oscillator for receiving the reference oscillation signal and generating the first local oscillation signal whose frequency is substantially equal to a sum of or a difference between a carrier frequency of the angle modulation signal and the offset frequency by generating a signal whose frequency converges to a frequency having a given ratio to a frequency of the received reference oscillation signal.

The computer that runs a program recorded on such a recording medium demodulates an angle modulation signal using a direct conversion scheme. Both of the first and second local oscillation signals are generated based on the single reference oscillation signal. This makes the structure simpler and adjustment easier. This feature stabilizes the frequency of each local oscillation signal, thus making the demodulation operation stable.

A computer readable recording medium according to the eighth aspect of the invention, which has recorded a program for allowing a computer to function as:

a first oscillation section for generating a first local oscillation signal and a first phase signal whose phase differs from that of the first local oscillation signal substantially by 90 degrees, a first mixing section for externally receiving an angle modulation signal, receiving the first local oscillation signal and the first phase signal from the first oscillation section, generating a first base band signal comprised of that of a product of an instantaneous value of the angle modulation signal and an instantaneous value of the first local oscillation signal from which a component with a frequency of substantially 0 is removed, and generating a second base band signal comprised of that of a product of the instantaneous value of the angle modulation signal and an instantaneous value of the first phase signal from which a component with a frequency of substantially 0 is removed, a second oscillation section for generating a second local oscillation signal whose frequency is substantially equal to a difference between or a sum of a predetermined intermediate frequency signal and an offset frequency of a predetermined range and a second phase signal whose phase differs from that of the second local oscillation signal substantially by 90 degrees, a second mixing section for receiving the first and second base band signals from the first mixing section, receiving the second local oscillation signal and the second phase signal from the second oscillation section, and generating an intermediate frequency signal representing a sum of or a difference between a product of an instantaneous value of the first base band signal and an instantaneous value of the second local oscillation signal and a product of an instantaneous value of the second base band signal and an instantaneous value of the second phase signal, and a demodulation section for receiving the intermediate frequency signal from the second mixing section and demodulating the intermediate frequency signal to thereby generate an angle demodulation signal; and for allowing the first oscillator to function as means for generating the first local oscillation signal whose frequency is substantially equal to a sum of or a difference between a carrier frequency of the angle modulation signal and the offset frequency by receiving the first base band signal or the second base band signal from the first mixing section, extracting a carrier component of the angle modulation signal included in the received first base band signal or second base band signal and generating a signal whose frequency converges to a frequency having a given ratio to a frequency of the extracted carrier component.

The computer that runs a program recorded on such a recording medium demodulates an angle modulation signal using a direct conversion scheme. The first local oscillation signal is generated based on the carrier component of the angle modulation signal that is extracted from the first base band signal or the second base band signal. This stabilizes the frequency of the first local oscillation signal, so that the demodulation operation by such a computer becomes stable. Further, the structure is simple and is easy to adjust.

A computer readable recording medium according to the ninth aspect of the invention, which has recorded a program for allowing a computer to function as a local oscillation apparatus for supplying a frequency converting apparatus for generating a base band signal based on a first local oscillation signal and an angle modulation signal and generating an intermediate frequency signal based on a second local oscillation signal and the base band signal, with the first and second local oscillation signals, and allowing the local oscillation apparatus to function as:

a reference oscillator for generating a reference oscillation signal;

a frequency divider for generating the second local oscillation signal whose frequency is substantially equal to a difference between or a sum of a predetermined intermediate frequency signal and an offset frequency of a predetermined range by frequency-dividing the reference oscillation signal by a predetermined first frequency dividing ratio; and a variable frequency oscillator for receiving the reference oscillation signal and generating the first local oscillation signal whose frequency is substantially equal to a sum of or a difference between a carrier frequency of the angle modulation signal and the offset frequency by generating a signal whose frequency converges to a frequency having a given ratio to a frequency of the received reference oscillation signal.

The computer that runs a program recorded on such a recording medium generates both of the first and second local oscillation signals based on the single reference oscillation signal. This makes the structure simpler and adjustment easier. Further, the frequency of each local oscillation signal becomes stable.

A computer data signal, carried on a carrier wave, according to the tenth aspect of the invention allows a computer to function as:

a first oscillator for generating a first local oscillation signal and a first phase signal whose phase differs from that of the first local oscillation signal substantially by 90 degrees, a first mixer for externally receiving an angle modulation signal, receiving the first local oscillation signal and the first phase signal from the first oscillator, generating a first base band signal comprised of that of a product of an instantaneous value of the angle modulation signal and an instantaneous value of the first local oscillation signal from which a component with a frequency of substantially 0 is removed, and generating a second base band signal comprised of that of a product of the instantaneous value of the angle modulation signal and an instantaneous value of the first phase signal from which a component with a frequency of substantially 0 is removed, a second oscillator for generating a second local oscillation signal and a second phase signal whose phase differs from that of the second local oscillation signal substantially by 90 degrees, a second mixer for receiving the first and second base band signals from the first mixer, receiving the second local oscillation signal and the second phase signal from the second oscillator, and generating an intermediate frequency signal representing a sum of or a difference between a product of an instantaneous value of the first base band signal and an instantaneous value of the second local oscillation signal and a product of an instantaneous value of the second base band signal and an instantaneous value of the second phase signal, and a demodulator for receiving the intermediate frequency signal from the second mixer and demodulating the intermediate frequency signal to thereby generate an angle demodulation signal;

allows the second oscillator to function as a reference oscillator for generating a reference oscillation signal, and a frequency divider for generating the second local oscillation signal whose frequency is substantially equal to a difference between or a sum of a predetermined intermediate frequency signal and an offset frequency of a predetermined range by frequency-dividing the reference oscillation signal by a predetermined first frequency dividing ratio; and allows the first oscillator to function as a variable frequency oscillator for receiving the reference oscillation signal and generating the first local oscillation signal whose frequency is substantially equal to a sum of or a difference between a carrier frequency of the angle modulation signal and the offset frequency by generating a signal whose frequency converges to a frequency having a given ratio to a frequency of the received reference oscillation signal.

This computer data signal permits a computer to demodulate an angle modulation signal using a direct conversion scheme. The computer data signal also allows both the first and second local oscillation signals to be generated based on the single reference oscillation signal. This makes the structure simpler and adjustment easier. Further, the frequency of each local oscillation signal becomes stable, thus making the demodulation operation stable.

A computer data signal, carried on a carrier wave, according to the eleventh aspect of the invention, allows a computer to function as:

a first oscillation section for generating a first local oscillation signal and a first phase signal whose phase differs from that of the first local oscillation signal substantially by 90 degrees, a first mixing section for externally receiving an angle modulation signal, receiving the first local oscillation signal and the first phase signal from the first oscillation section, generating a first base band signal comprised of that of a product of an instantaneous value of the angle modulation signal and an instantaneous value of the first local oscillation signal from which a component with a frequency of substantially 0 is removed, and generating a second base band signal comprised of that of a product of the instantaneous value of the angle modulation signal and an instantaneous value of the first phase signal from which a component with a frequency of substantially 0 is removed, a second oscillation section for generating a second local oscillation signal whose frequency is substantially equal to a difference between or a sum of a predetermined intermediate frequency signal and an offset frequency of a predetermined range and a second phase signal whose phase differs from that of the second local oscillation signal substantially by 90 degrees, a second mixing section for receiving the first and second base band signals from the first mixing section, receiving the second local oscillation signal and the second phase signal from the second oscillation section, and generating an intermediate frequency signal representing a sum of or a difference between a product of an instantaneous value of the first base band signal and an instantaneous value of the second local oscillation signal and a product of an instantaneous value of the second base band signal and an instantaneous value of the second phase signal, and a demodulation section for receiving the intermediate frequency signal from the second mixing section and demodulating the intermediate frequency signal to thereby generate an angle demodulation signal; and allows the first oscillator to function as means for generating the first local oscillation signal whose frequency is substantially equal to a sum of or a difference between a carrier frequency of the angle modulation signal and the offset frequency by receiving the first base band signal or the second base band signal from the first mixing section, extracting a carrier component of the angle modulation signal included in the received first base band signal or second base band signal and generating a signal whose frequency converges to a frequency having a given ratio to a frequency of the extracted carrier component.

This computer data signal permits a computer to demodulate an angle modulation signal using a direct conversion scheme. The first local oscillation signal is generated based on the carrier component of the angle modulation signal that is extracted from the first base band signal or the second base band signal. This stabilizes the frequency of the first local oscillation signal, so that the demodulation operation becomes stable. Further, the structure is simple and is easy to adjust.

A computer data signal, carried on a carrier wave, according to the twelfth aspect of the invention, allows a computer to function as a local oscillation apparatus for supplying a frequency converting apparatus for generating a base band signal based on a first local oscillation signal and an angle modulation signal and generating an intermediate frequency signal based on a second local oscillation signal and the base band signal, with the first and second local oscillation signals, and allowing the local oscillation apparatus to function as:

a reference oscillator for generating a reference oscillation signal;

a frequency divider for generating the second local oscillation signal whose frequency is substantially equal to a difference between or a sum of a predetermined intermediate frequency signal and an offset frequency of a predetermined range by frequency-dividing the reference oscillation signal by a predetermined first frequency dividing ratio; and a variable frequency oscillator for receiving the reference oscillation signal and generating the first local oscillation signal whose frequency is substantially equal to a sum of or a difference between a carrier frequency of the angle modulation signal and the offset frequency by generating a signal whose frequency converges to a frequency having a given ratio to a frequency of the received reference oscillation signal.

This computer data signal permits a computer to generate both the first and second local oscillation signals based on the single reference oscillation signal. This makes the structure simpler and adjustment easier. Further, the frequency of each local oscillation signal becomes stable.

DETAILED DESCRIPTION OF THE PREFERRED EMBODIMENTS

An angle demodulation apparatus and angle demodulation method according to preferred embodiments of the present invention, as adapted to an FM (Frequency Modulation) receiver, will now be described with reference to the accompanying drawings.

First Embodiment

Figure 1:
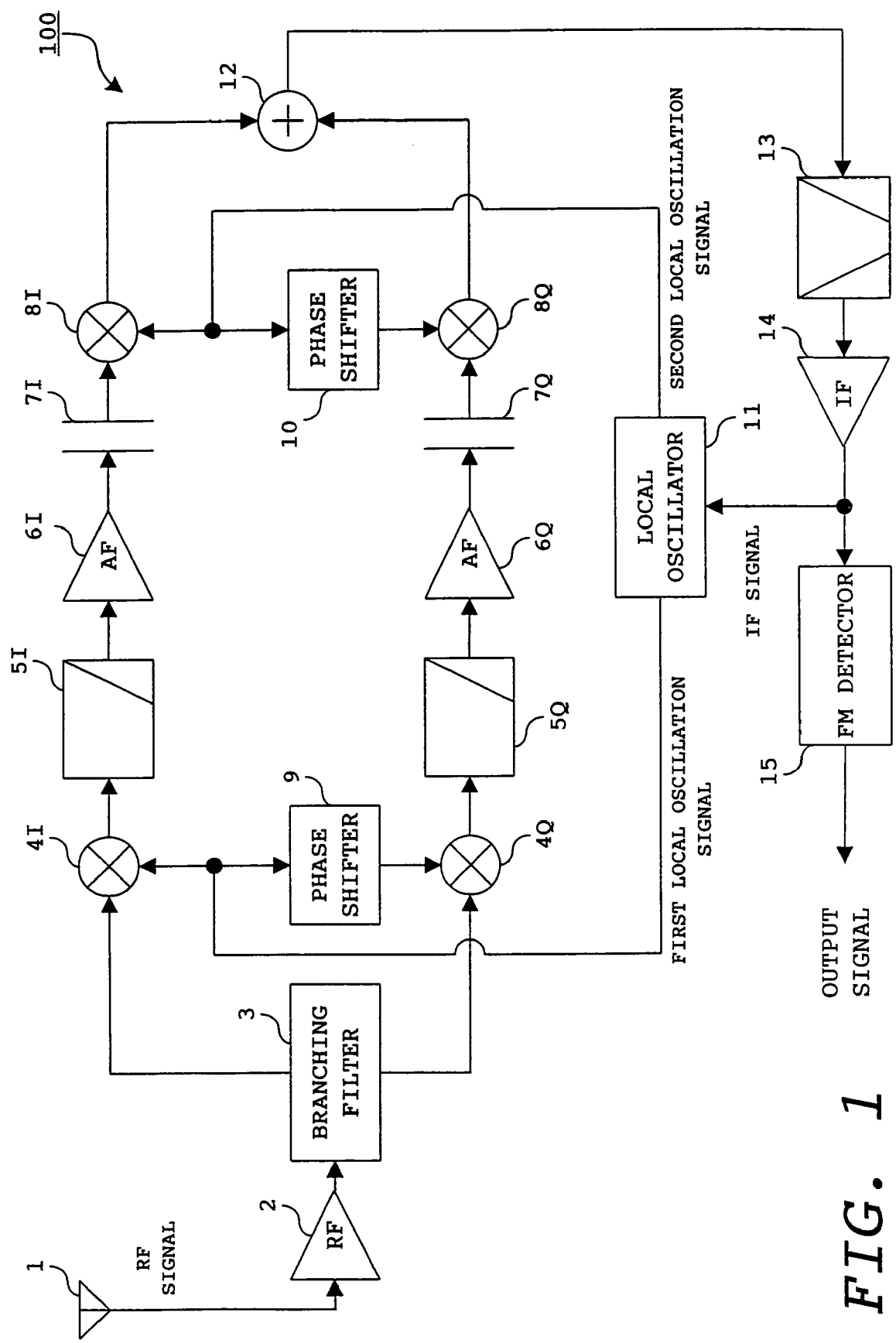
FIG. 1 is a block diagram showing the basic structure of an FM receiver according to a first embodiment of the present invention.

FIG. 1 illustrates one example of the structure of an FM receiver 100 according to the first embodiment of the invention.

As shown in FIG. 1, the FM receiver 100 comprises an antenna 1, an RF (Radio Frequency) amplifier 2, a branching filter 3, mixers 4I, 4Q, 8I and 8Q, LPFs (Low Pass Filters) 5I and 5Q, DC eliminating sections 7I and 7Q, phase shifters 9 and 10, a local oscillator 11, and adder 12, a BPF (Band Pass Filter) 13, an IF (Intermediate Frequency) amplifier 14 and an FM detector 15.

The RF amplifier 2 receives a signal (RF signal), which is induced on the antenna 1 by an electromagnetic wave, from the antenna 1. The RF amplifier 2 amplifies the signal from the antenna 1 and sends the amplified signal to the branching filter 3.

The branching filter 3 supplies the mixers 4I and 4Q with the RF signal sent from the RF amplifier 2.

The mixers 4I and 4Q have substantially the same structures. The mixer 4I generates an I channel base band signal and sends it to the LPF 5I. The I channel base band signal represents the product of the RF signal, supplied to the mixer 4I from the branching filter 3, and a first local oscillation signal (to be discussed later) supplied to the mixer 4I from the local oscillator 11. The mixer 4Q generates a Q channel base band signal and sends it to the LPF 5Q. The Q channel base band signal represents the product of the RF signal, supplied to the mixer 4Q from the branching filter 3, and a first phase signal (to be discussed later) supplied to the mixer 4Q from the phase shifter 9.

The LPFs 5I and 5Q have substantially the same structures. The LPFs 5I and 5Q respectively filter the I channel base band signal supplied from the mixer 4I and the Q channel base band signal supplied from the mixer 4Q. Specifically, the LPF 5I eliminates the frequency component of the I channel base band signal which lies above the band of an AF signal (to be discussed later) to be reproduced. The LPF 5I sends the remaining frequency component to the AF amplifier 6I. The LPF SQ eliminates the frequency component of the Q channel base band signal which lies above the band of an AF signal to be reproduced. The LPF SQ sends the remaining frequency component to the AF amplifier 6Q.

The AF amplifiers 6I and 6Q have substantially the same structures. The AF amplifier 6I amplifies the signal supplied from the LPF 5I and sends the amplified signal to the DC eliminating section 7I. The AF amplifier 6Q amplifies the signal supplied from the LPF 5Q and sends the amplified signal to the DC eliminating section 7Q.

The DC eliminating sections 7I and 7Q have substantially the same structures, and are comprised of, for example, a capacitor or an HPF (High Pass Filter). The DC eliminating section 7I eliminates the DC component from the signal supplied from the AF amplifier 6I and sends the other component to the mixer 8I. The DC eliminating section 7Q eliminates the DC component from the signal supplied from the AF amplifier 6Q and sends the other component to the mixer 8Q.

The mixers 8I and 8Q have substantially the same structures. The mixer 8I generates a signal that represents a component which is contained in the product of the signal supplied from the DC eliminating section 7I and a second local oscillation signal (to be discussed later) supplied from the local oscillator 11 and whose frequency is substantially equal to the sum of (or difference between) the frequencies of those two signals. The mixer 8I then sends the signal to the adder 12. The mixer 8Q generates a signal that represents a component which is contained in the product of the signal supplied from the DC eliminating section 7Q and a second phase signal (to be discussed later) supplied from the phase shifter 10 and whose frequency is substantially equal to the sum of (or difference between) the frequencies of those two signals. The mixer 8Q then sends the signal to the adder 12.

When receiving the first local oscillation signal from the local oscillator 11, the phase shifter 9 generates the first phase signal and sends it to the mixer 4Q. The first phase signal is the first local oscillation signal whose phase is delayed substantially by 90 degrees.

When receiving the second local oscillation signal from the local oscillator 11, the phase shifter 10 generates the second phase signal and sends it to the mixer 8Q. The second phase signal is the second local oscillation signal whose phase is delayed substantially by 90 degrees.

The adder 12 generates a signal which represents the sum of the signals supplied from the mixers 8I and 8Q and sends the signal to the BPF 13.

The BPF 13 filters the signal supplied from the adder 12. Specifically, the BPF 13 supplies the IF amplifier 14 with that component in the signal supplied from the adder 12 whose frequency lies in a band near a predetermined intermediate frequency, and substantially cuts off the other component.

The IF amplifier 14 amplifies the component (IF signal) from the BPF 13 and sends the resultant signal to the FM detector 15 and the local oscillator 11.

The FM detector 15 includes a ratio detector, a quadrature demodulator or other arbitrary FM detection circuit, an AF amplifier and a speaker. The FM detector 15 performs FM demodulation of the IF signal by converting the frequency change of the signal supplied from the IF amplifier 14 to an amplitude. The AF signal that is acquired by demodulation is sent out as the output signal of the FM receiver 100 and is reproduced.

Figure 2:
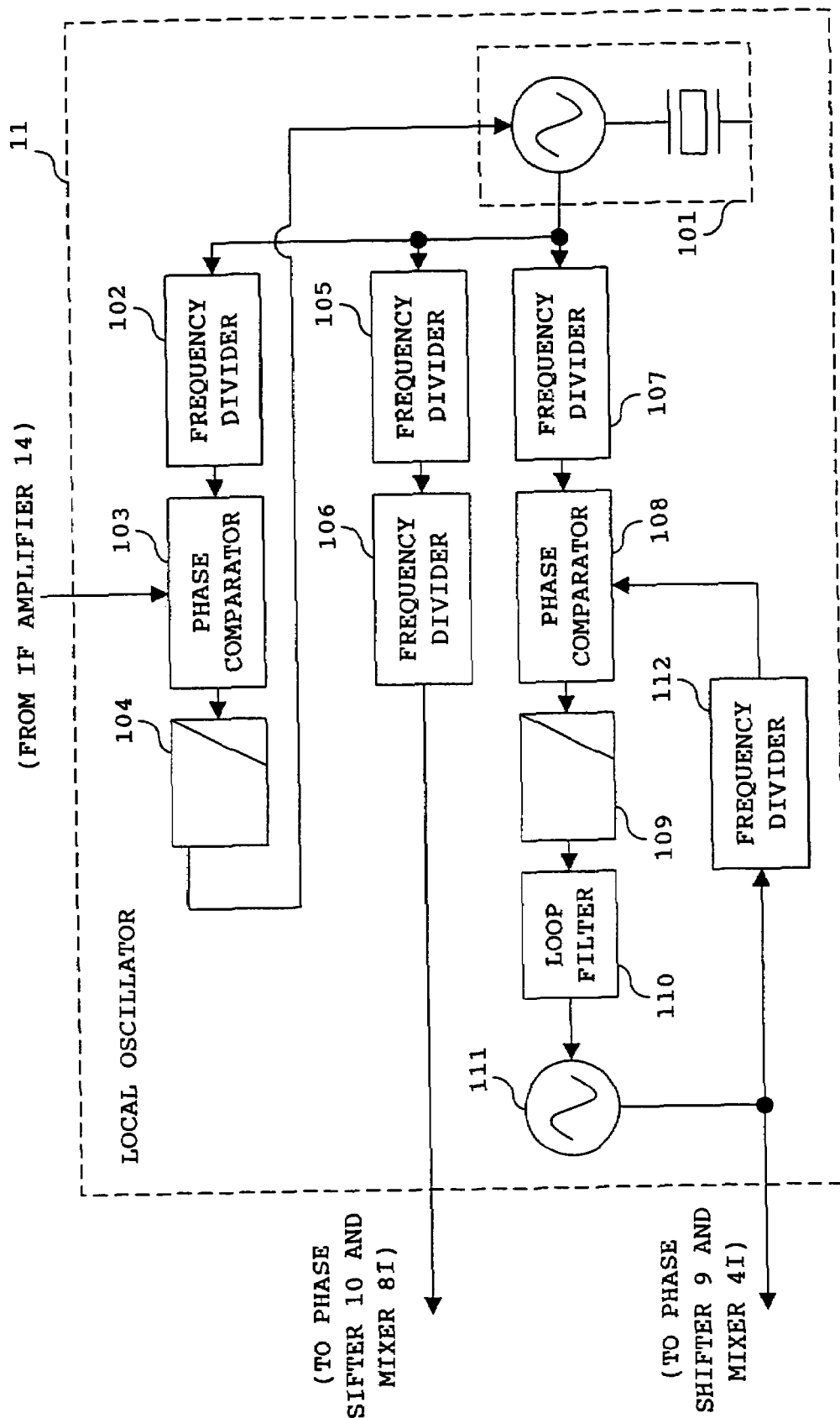
FIG. 2 is a block diagram showing the basic structure of a local oscillator in the FM receiver in FIG. 1.

The local oscillator 11 comprises VCOs (Voltage Controlled Oscillators) 101 and 111, frequency dividers 102, 105, 106, 107 and 112, phase comparators 103 and 108, LPFs 104 and 109 and a loop filter 110, as shown in FIG. 2.

Each of the VCOs 101 and 111 generates an AC signal, and changes the frequency of the generated AC signal by an amount specified by a control signal supplied to itself. Without the control signal supplied, each VCO 101 or 111 generates an AC signal of, for example, a free running frequency specific to itself The VCO 101 supplies the AC signal (reference oscillation signal), locally generated, to the frequency dividers 102, 105 and 107. The VCO 111 supplies the AC signal, locally generated, to the frequency divider 112. The VCO 111 also supplies the locally-generated AC signal to the mixer 41 and the phase shifter 9 as the first local oscillation signal.

The frequency dividers 102, 105, 106, 107 and 112 are each comprised of, for example, a flip-flop circuit, a counter circuit or the like.

The frequency divider 102 frequency-divides the AC signal supplied from the VCO 101 by a frequency dividing ratio p (p being an integer). That is, the frequency divider 102 generates an AC signal which is synchronous with the reference oscillation signal and has a frequency substantially equal to 1/p of the frequency of the reference oscillation signal.

The frequency divider 102 then sends the signal, acquired by the frequency division performed locally, to the phase comparator 103.

The frequency divider 105 frequency-divides the AC signal supplied from the VCO 101 by a frequency dividing ratio q (q being an integer), and sends the signal, acquired by the frequency division performed locally, to the frequency divider 106.

The frequency divider 106 frequency-divides the AC signal supplied from the frequency divider 105 by a frequency dividing ratio r (r being an integer), and sends the signal, acquired by the frequency division performed locally, to the mixer 81 and the phase shifter 10 as the second local oscillation signal.

The frequency divider 107 frequency-divides the AC signal supplied from the VCO 101 by a frequency dividing ratio s (s being an integer), and sends the signal, acquired by the frequency division performed locally, to the phase comparator 108.

The frequency divider 112 frequency-divides the AC signal supplied from the VCO 111 by a frequency dividing ratio t (t being an integer), and sends the signal, acquired by the frequency division performed locally, to the phase comparator 108.

The phase comparator 103 is comprised of a multiplication circuit or the like. The phase comparator 103 generates a control signal and sends the control signal to the LPF 104. The control signal that is generated by the phase comparator 103 represents a phase difference between the AC signal supplied from the frequency divider 102 and the carrier component of the signal supplied from the IF amplifier 14.

The LPF 104 eliminates a harmonic component contained in the control signal supplied from the phase comparator 103. The LPF 104 supplies the VCO 101 with the control signal from which the harmonic component has substantially been eliminated.

When the phase difference between the carrier component of the signal supplied from the IF amplifier 14 and the signal supplied from the frequency divider 102 is substantially 0, the control signal that is output from the phase comparator 103 specifies that a change in the frequency of the reference oscillation signal is substantially 0. That is, the control signal output from the phase comparator 103 designates that the frequency of the AC signal currently generated by the VCO 101 should be maintained.

When the phase of the carrier component of the signal supplied from the IF amplifier 14 leads the phase of the signal supplied from the frequency divider 102, the change that is indicated by the control signal output from the phase comparator 103 takes a positive value. That is, the control signal designates that the frequency of the reference oscillation signal should be increased. When the phase of the carrier component of the signal supplied from the IF amplifier 14 lags behind the phase of the signal supplied from the frequency divider 102, the change that is indicated by the control signal output from the phase comparator 103 takes a negative value. That is, the control signal designates that the frequency of the reference oscillation signal should be lowered. It is to be noted that in both cases where the change takes a positive value and a negative value, the absolute value of the change that is specified by the control signal becomes larger as the phase difference between the carrier component of the signal supplied from the IF amplifier 14 and the signal supplied from the frequency divider 102 gets larger.

It is apparent from the above that the VCO 101, the frequency divider 102, the phase comparator 103 and the LPF 104 serve as a first PLL (Phase-Locked Loop) which controls the frequency of the reference oscillation signal.

The phase comparator 108 is comprised of a multiplication circuit or the like. The phase comparator 108 generates an error signal and sends the error signal to the LPF 109. The error signal that is generated by the phase comparator 108 is comprised of a signal which represents a phase difference between the two AC signals supplied from the frequency dividers 107 and 112 as the duty ratio of a rectangular wave.

The LPF 109 eliminates a harmonic component contained in the error signal supplied from the phase comparator 108. The LPF 109 supplies the loop filter 110 with the error signal from which the harmonic component has substantially been eliminated.

The loop filter 110 is comprised of an integration circuit or the like. The loop filter 110 generates a control signal based on the error signal supplied from the LPF 109 and sends the control signal to the VCO 111. The control signal that is generated by the loop filter 110 is comprised of a signal which has a level representing the duty ratio of the error signal supplied from the LPF 109.

When the phase difference between the two signals supplied from the frequency dividers 107 and 112 is substantially 0, the error signal output from the phase comparator 108 causes the loop filter 110 to generate the control signal which specifies that a change in the frequency of the AC signal generated by the VCO 111 is substantially 0.

When the phase of the carrier component of the signal supplied from the frequency divider 112 leads the phase of the signal supplied from the frequency divider 107, the error signal output from the phase comparator 108 causes the loop filter 110 to output the control signal that indicates a negative change. When the phase of the carrier component of the signal supplied from the frequency divider 112 lags behind the phase of the signal supplied from the frequency divider 107, the error signal output from the phase comparator 108 causes the loop filter 110 to output the control signal that indicates a positive change. In both cases of a positive change and a negative change, the absolute value of the change that is specified by the control signal output from the loop filter 110 becomes larger as the phase difference between the two signals supplied from the frequency dividers 107 and 112 gets larger.

It is apparent from the above that the VCO 111, the frequency dividers 107 and 112, the phase comparator 108, the LPF 109 and the loop filter 110 serve as a second PLL which controls the frequency of the AC signal generated by the VCO 111.

The values of the aforementioned frequency dividing ratios p, q, r, s and t are set in such a way that:

(A) An operation to be discussed later causes the frequency of the first local oscillation signal to converge to the sum of (or the difference between) the carrier frequency of the FM modulation signal to be received by the FM receiver 100 and a predetermined offset frequency, (B) The operation to be discussed later causes the frequency of the second local oscillation signal to converge to the difference between (or the sum of) a predetermined intermediate frequency within the pass band of the BPF 13 and the offset frequency, and (C) The operation to be discussed later causes the frequency of the AC signal that is supplied to the phase comparator 103 from the frequency divider 102 to converge to the aforementioned intermediate frequency.

Further, it is desirable that (D) The offset frequency should lie within a range of 300 Hz. In the case where an AF signal to be reproduced represents a speech, even if the component of the speech which has a frequency of about 300 Hz or lower is not reproduced, the precision of the speech to be reproduced is not deteriorated. In this case, therefore, the DC eliminating sections 7I and 7Q which eliminate the DC components from the I channel base band signal and the Q channel base band signal should not necessarily eliminate only the DC components accurately. If the DC eliminating sections 7I and 7Q eliminate those components whose frequencies are substantially lower than the offset frequency, precise demodulation is not impaired. It is possible to remove the DC components of the secondary distortion caused by the mixers 4I and 4Q, without erroneously eliminating the carrier components of the I channel base band signal and the Q channel base band signal.

In other words, the values of the frequency dividing ratios p, q, r, s and t are set to values which substantially satisfy the relationships that are given by the following equations 1 to 3. It is also desirable that an equation 4 below should be met. In those equations, $f_0$ is the carrier frequency of the FM modulation signal to be received by the FM receiver 100, $f_1$ is the value to which the frequency of the first local oscillation signal converges, $f_2$ is the value to which the frequency of the second local oscillation signal converges, $f_{IF}$ is the intermediate frequency and $\Delta f$ is the offset frequency.

$$f_1 = f_0 \pm \Delta f \tag{1}$$

$$(f_1/t) = f_2 \cdot \{(\cdot r)/s\} \tag{2}$$

$$f_2 \cdot \{(q \cdot r)/p\} = (f_2 \pm \Delta f) = f_{IF} \tag{3}$$

$$\Delta f \leq 300 \, [Hz] \tag{4}$$

Specifically, provided that the carrier frequency of the FM modulation signal to be received by the FM receiver 100 is 470 MHz, the offset frequency is 72 Hz and the intermediate frequency is 36.072149 KHz, for example, the relationships given by the equations 1 to 4 are satisfied if the values of the frequency dividing ratios p, q, r, s and t are respectively "499", "250", "2", "360" and "9400".

At this time, the frequency of the first local oscillation signal converges to approximately 470.000072 MHz, the frequency of the second local oscillation signal converges to approximately 36.0000055 KHz, and the frequency of the AC signal that is supplied to the phase comparator 103 from the frequency divider 102 converges to approximately 36.072149 KHz.

Operation of First Embodiment

The operation of the FM receiver 100 will be described below.

When the FM modulation signal to be received by the FM receiver 100 induces an RF signal on the antenna 1, the RF amplifier 2 amplifies the RF signal and sends the amplified signal to the branching filter 3. The branching filter 3 supplies the mixers 4I and 4Q with the RF signal supplied from the RF amplifier 2.

The first local oscillation signal that is generated by the VCO 111 in the local oscillator 11 is supplied to the mixer 4I. The first phase signal is supplied to the mixer 4Q from the phase shifter 9. The first phase signal is a signal equivalent to the first local oscillation signal whose phase is substantially delayed by 90 degrees.

The frequency of the AC signal output from the VCO 111 rises when the frequency of the signal output from the frequency divider 107 is higher than the frequency of the signal output from the frequency divider 112, and falls when the former frequency is lower than the latter. The frequency of the signal output from the frequency divider 107 is 1/s of the frequency of the reference oscillation signal. The frequency of the signal output from the frequency divider 112 is 1/t of the frequency of the AC signal that is currently generated by the VCO 111 itself. The frequency of the first local oscillation signal therefore converges to t/s of the frequency of the AC signal output from the VCO 101.

The mixer 4I generates the I channel base band signal. This I channel base band signal is filtered by the LPF 5I and is then amplified by the AF amplifier 6I. The DC component of the amplified signal is eliminated by the DC eliminating section 7I. The resultant signal is then supplied to the mixer 8I.

The mixer 4Q generates the Q channel base band signal. This Q channel base band signal is filtered by the LPF SQ and is then amplified by the AF amplifier 6Q. The DC component of the amplified signal is eliminated by the DC eliminating section 7Q. The resultant signal is then supplied to the mixer 8Q.

The frequency of the carrier component of the FM modulation signal which is included in each of the I channel base band signal and the Q channel base band signal converges to a value substantially equal to the offset frequency.

The mixer 8I receives the second local oscillation signal output from the frequency divider 106 in the local oscillator 11. The mixer 8Q receives the second phase signal from the phase shifter 10. The second phase signal is a signal equivalent to the second local oscillation signal whose phase is substantially delayed by 90 degrees.

The mixer 8I generates a signal representing that component in the product of the signal supplied from the DC eliminating section 7I and the second local oscillation signal whose frequency is substantially equal to the sum of (or the difference between) those two signals, and sends the signal to the adder 12. The second local oscillation signal is the reference oscillation signal frequency-divided by the frequency dividing ratio q by the frequency divider 105 and further frequency-divided by the frequency dividing ratio r by the frequency divider 106.

The mixer 8Q generates a signal representing that component in the product of the signal supplied from the DC eliminating section 7Q and the second phase signal whose frequency is substantially equal to the sum of (or the difference between) those two signals, and sends the signal to the adder 12.

The adder 12 produces a signal representing the sum of the signals supplied from the mixers 8I and 8Q. This signal is filtered by the BPF 13 to be an IF signal which is in turn amplified by the IF amplifier 14.

The IF signal amplified by the IF amplifier 14 is subjected to FM demodulation in the FM detector 15. The AF signal that is yielded by the demodulation is output as the output signal of the FM receiver 100 and is reproduced.

The signal that is amplified by the IF amplifier 14 is also supplied to the phase comparator 103 in the local oscillator 11.

The control signal that is output from the phase comparator 103 lowers the frequency of the reference oscillation signal when the frequency of the signal output from the frequency divider 102 (i.e., 1/p of the frequency of the reference oscillation signal) is higher than the intermediate frequency. The control signal increases the frequency of the reference oscillation signal when the frequency of the signal output from the frequency divider 102 is lower than the intermediate frequency. Therefore, the frequency of the AC signal output from the VCO 10I converges to a value which is p times the intermediate frequency. The frequency of the second local oscillation signal is $1/(q\tau)$ of the frequency of the reference oscillation signal.

The frequency of the carrier component of the FM modulation signal which is included in the IF signal converges to a value substantially equal to the sum of (or the difference between) the frequency of the second local oscillation signal and the offset frequency.

Through the above-described operation, the FM modulation signal received by the FM receiver 100 is demodulated and a speech represented by the AF signal is reproduced.

The FM receiver 100 demodulates an FM modulation signal using a direct conversion scheme. Both of the first and second local oscillation signals are generated based on the single reference oscillation signal. This makes the structure simpler. The frequency of the reference oscillation signal converges to a value which is p times the intermediate frequency. The FM receiver 100 is therefore easy to adjust.

Second Embodiment

According to the first embodiment discussed above, an intermediate frequency signal is extracted and the frequency of the first local oscillation signal is made to converge to a value which has a given ratio to the frequency of the carrier component of the extracted intermediate frequency signal using a PLL. This makes the frequency of the first local oscillation signal become the frequency that is offset by a predetermined amount from the carrier frequency of the FM modulation signal to be received. It is therefore possible to easily remove a DC component from the base band signal by using an HPF without sacrificing precision. The structure of the first embodiment of the invention is simple and is easy to adjust. The offset amount of the frequency of the first local oscillation signal becomes more stable than is set in the case of offsetting the same frequency using the conventional scheme.

But, an intermediate frequency signal is a frequency-modulated signal, and its frequency varies constantly. When the scheme of the first embodiment is used, therefore, the offset amount of the frequency of the first local oscillation signal may still become unstable. If the offset amount of the frequency of the first local oscillation signal should become unstable, the demodulation operation of the FM receiver would become unstable.

The following will discuss the second embodiment of the invention which generates local oscillation signals which have more stable frequencies and perform stable demodulation using the direct conversion scheme.

Figure 3:
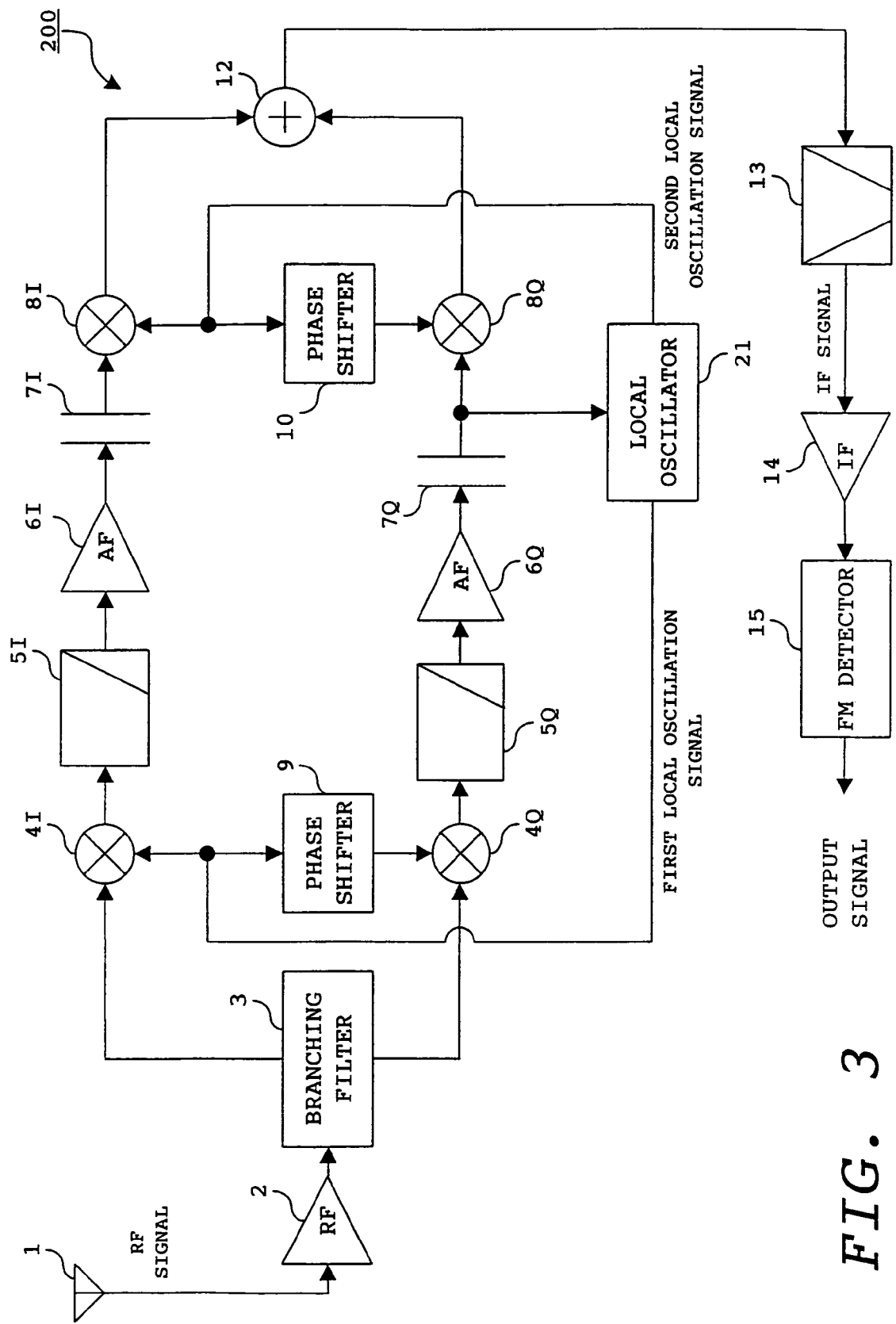
FIG. 3 is a block diagram illustrating the basic structure of an FM receiver according to a second embodiment of the invention.

FIG. 3 exemplifies the structure of an FM receiver 200 according to the second embodiment of the invention.

As illustrated, the structure of the FM receiver 200 is substantially the same as the structure of the FM receiver 100 shown in FIG. 1 except that a local oscillator 21 is used in place of the local oscillator 11. The first and second local oscillation signals are supplied from the local oscillator 21 in place of the local oscillator 11.

It is to be noted that the DC eliminating section 7Q supplies the local oscillator 21 as well as the mixer 8Q with that component of the signal supplied from the AF amplifier 6Q which excludes the DC component. The IF amplifier 14 does not send the IF signal to the local oscillator 21.

Figure 4:
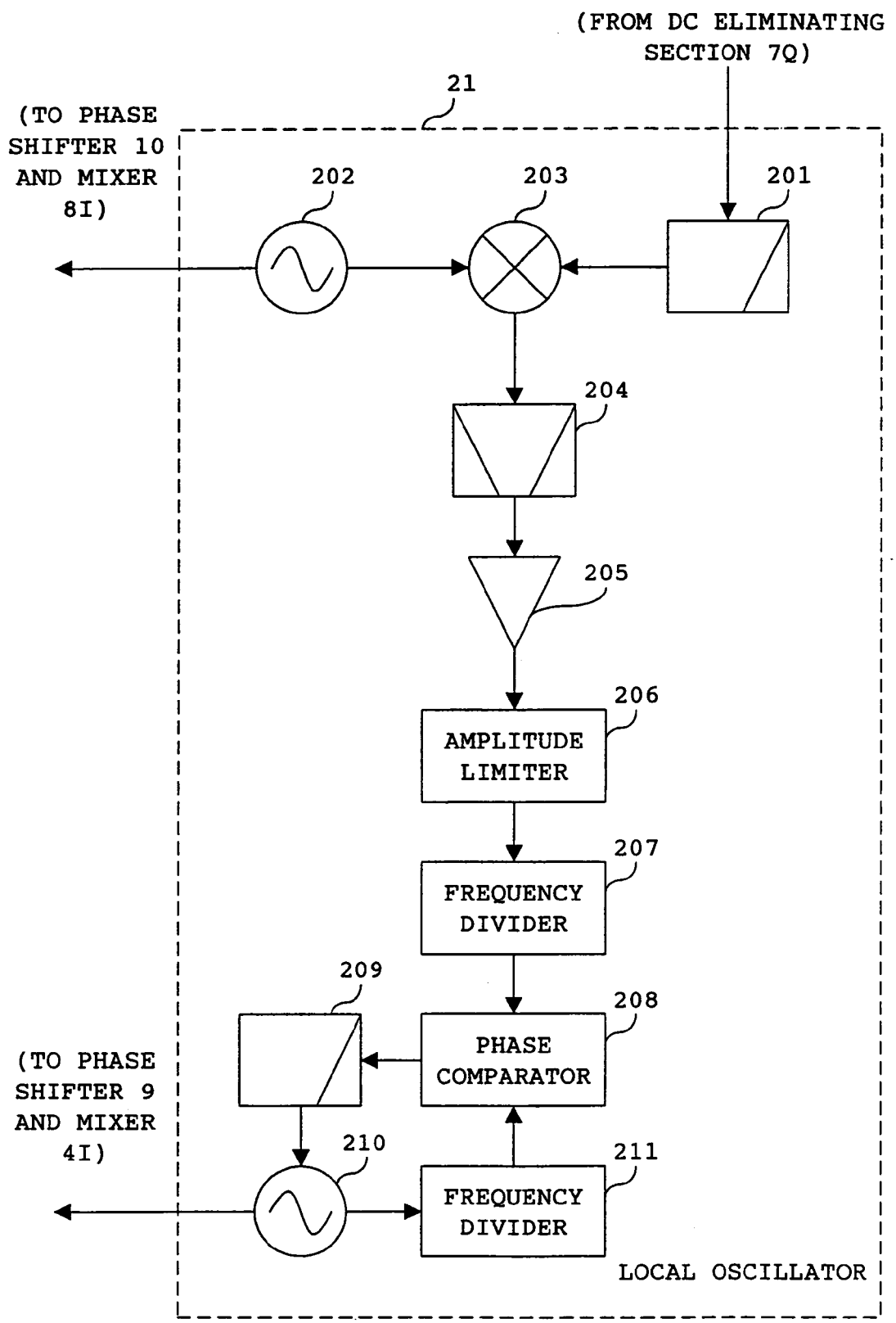
FIG. 4 is a block diagram depicting the basic structure of a local oscillator in the FM receiver in FIG. 3.
Figure 5:
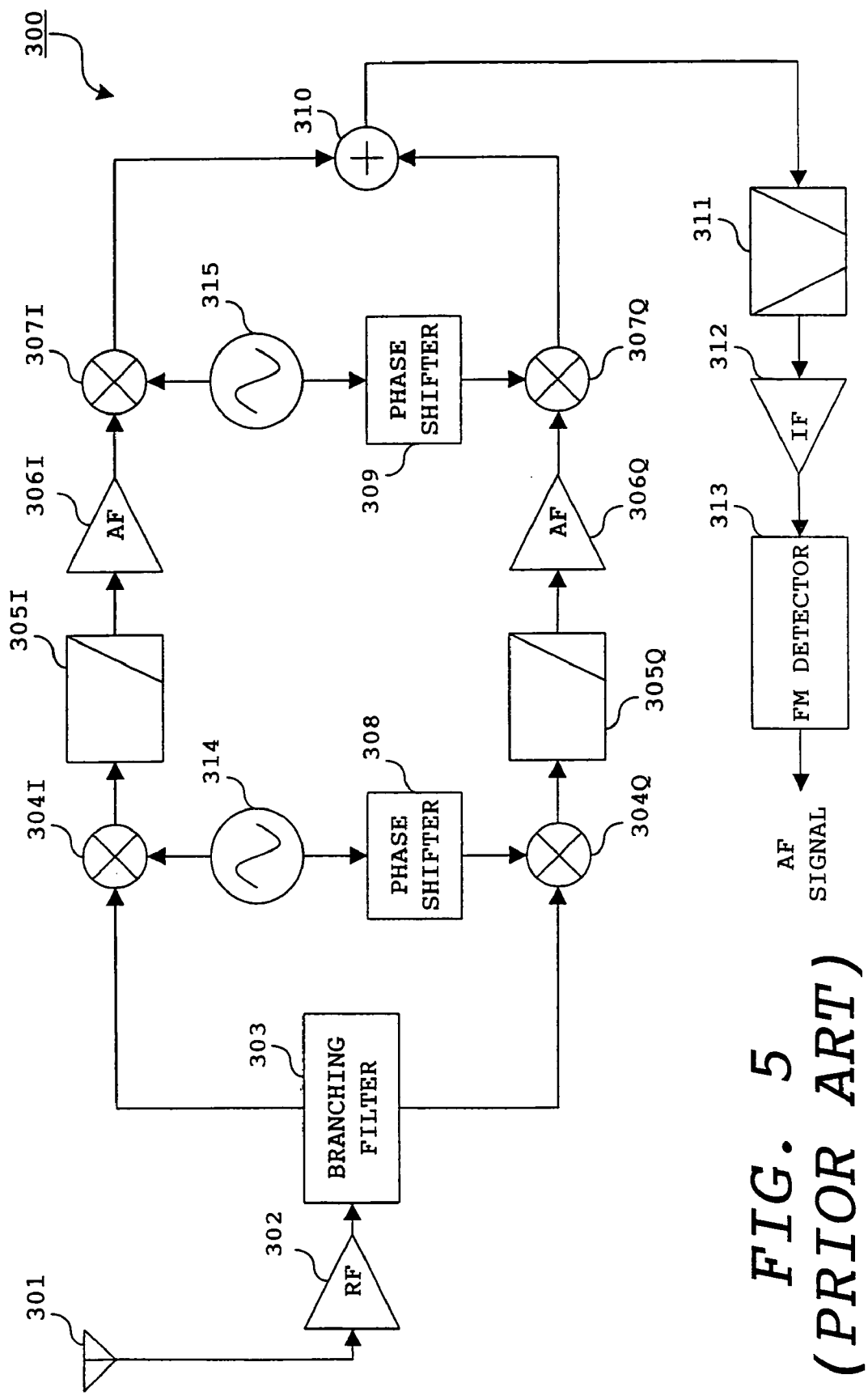
FIG. 5 is a block diagram showing the structure of a conventional FM receiver.

As shown in FIG. 4, the local oscillator 21 comprises an LPFs 201 and 209, an oscillator 202, a mixer 203, a BPF 204, an amplifier 205, an amplitude limiter 206, frequency dividers 207 and 211, a phase comparator 208 and a VCO 210.

The LPF 201 supplies the mixer 203 with that component of the signal supplied from the DC eliminating section 7Q whose frequency is equal to or lower than a predetermined offset frequency, and substantially eliminates the component whose frequency exceeds the offset frequency.

The oscillator 202 generates an AC signal and sends the signal to the mixer 203. The oscillator 202 also sends the AC signal as the aforementioned second local oscillation signal to the phase shifter 10 and the mixer 8I. The frequency of the second local oscillation signal is substantially equal to the difference between (or the sum of) a predetermined intermediate frequency signal within the pass band of the BPF 13 and the offset frequency.

The mixer 203 generates a signal which represents the product of the signal supplied from the LPF 201 and the second local oscillation signal supplied from the oscillator 202, and sends the signal to the BPF 204.

The BPF 204 supplies the amplifier 205 with that component of the signal supplied from the mixer 203 whose frequency is equivalent to the sum of (or the difference between) the frequency of the signal supplied from the LPF 201 and the frequency of the second local oscillation signal, and substantially eliminates the other component.

The amplifier 205 amplifies the component supplied from the BPF 204 and sends the amplified component to the amplitude limiter 206.

The amplitude limiter 206 supplies the frequency divider 207 with a signal which is acquired by limiting the component supplied from the amplifier 205 to or below a predetermined value.

The VCO 210 generates an AC signal, and changes the frequency of the AC signal by an amount specified by a control signal supplied to itself. Without the control signal supplied, the VCO 210 generates an AC signal of, for example, a free running frequency specific to itself.

The VCO 210 supplies the AC signal, locally generated, to the frequency divider 211, and also supplies this AC signal to the mixer 4I and the phase shifter 9 as the first local oscillation signal.

The frequency dividers 207 and 211 are each comprised of, for example, a flip-flop circuit, a counter circuit or the like.

The frequency divider 207 frequency-divides the signal supplied from the amplitude limiter 206 by a frequency dividing ratio M (M being an integer). That is, the frequency divider 207 generates a signal which is synchronous with the signal supplied from the amplitude limiter 206 and has a frequency substantially equal to 1/M of the frequency of this signal. The frequency divider 207 then sends the signal, acquired by the frequency division performed locally, to the phase comparator 208.

The frequency divider 211 frequency-divides the AC signal supplied from the VCO 210 by a frequency dividing ratio N (N being an integer), and sends the signal, acquired by the frequency division performed locally, to the phase comparator 208.

The phase comparator 208 is comprised of a multiplication circuit or the like. The phase comparator 208 generates a control signal which represents a phase difference between the signal supplied from the frequency divider 207 and the signal supplied from the frequency divider 211, and sends the control signal to the LPF 209.

The LPF 209 eliminates a harmonic component contained in the control signal supplied from the phase comparator 208, and supplies the VCO 210 with the control signal from which the harmonic component has substantially been eliminated.

When the phase difference between the signal supplied from the frequency divider 207 and the signal supplied from the frequency divider 211 is substantially 0, the control signal that is output from the phase comparator 208 specifies that a change in the frequency of the first local oscillation signal is substantially 0.

When the phase of the signal supplied from the frequency divider 207 leads the phase of the signal supplied from the frequency divider 211, the change that is indicated by the control signal output from the phase comparator 208 takes a positive value. When the phase of the signal supplied from the frequency divider 207 lags behind the phase of the signal supplied from the frequency divider 211, the change that is indicated by the control signal output from the phase comparator 208 takes a negative value. It is to be noted that in both cases where the change takes a positive value and a negative value, the absolute value of the change that is specified by the control signal becomes larger as the phase difference between the signal supplied from the frequency divider 207 and the signal supplied from the frequency divider 211 gets larger.

It is therefore apparent from the above that the phase comparator 208, the LPF 209, the VCO 210 and the frequency divider 211 serve as the PLL that controls the frequency of the first local oscillation signal.

The values of the frequency dividing ratios M and N are set to values such that an operation to be discussed later causes the frequency of the first local oscillation signal to converge to the sum of (or the difference between) the carrier frequency of the FM modulation signal to be received by the FM receiver 200 and the offset frequency. It is desirable that the offset frequency for the FM receiver 200 should lie within a range of 300 Hz.

In other words, the values of the frequency dividing ratios M and N are set to the values that substantially satisfy the relationships given by the following equations 5 to 7, where $f_0$ is the carrier frequency of the FM modulation signal to be received by the FM receiver 200, $f_1$ is the value to which the frequency of the first local oscillation signal converges, $f_2$ is the value to which the frequency of the second local oscillation signal converges, $f_{IF}$ is the intermediate frequency and $\Delta f$ is the offset frequency. It is also desirable that an equation 8 below should be satisfied.

$$f_1 = f_0 \pm \Delta f \quad (5)$$

$$(f_1/N) = (f_2 \pm \Delta f)/M \quad (6)$$

$$(f_2 \pm \Delta f) = f_{IF} \quad (7)$$

$$\Delta f \leq 300 \ [\text{Hz}] \quad (8)$$

Operation of Second Embodiment

The operation of the FM receiver 200 will be described below.

When the FM modulation signal to be received by the FM receiver 200 induces an RF signal on the antenna 1, the RF amplifier 2 amplifies the RF signal. The amplified signal is sent to the mixers 4I and 4Q via the branching filter 3.

Then, the mixer 4I generates an I channel base band signal. The I channel base band signal is filtered by the LPF 5I and is then amplified by the AF amplifier 6I. The DC component of the amplified signal is eliminated by the DC eliminating section 7I. The resultant signal is then supplied to the mixer 8I. The mixer 4Q generates a Q channel base band signal. The Q channel base band signal is filtered by the LPF 5Q and is then amplified by the AF amplifier 6Q. The DC component of the amplified signal is eliminated by the DC eliminating section 7Q. The resultant signal is then supplied to the mixer 8Q.

The first local oscillation signal that is supplied to the mixer 4I and the phase shifter 9 is generated by the VCO 210 in the local oscillator 2I.

Suppose that the difference between the frequency of the first local oscillation signal and the carrier frequency of the FM modulation signal to be received by the FM receiver 200 becomes substantially equal to the offset frequency. In this case, the BPF 204 of the local oscillator 21 outputs a signal equivalent to the carrier component of the FM modulation signal frequency-converted by the mixer 203. This signal is amplified by the amplifier 205 and is so shaped as to have a given amplitude by the amplitude limiter 206. The resultant signal is frequency-divided by M by the frequency divider 207 and is then output.

When the frequency divider 207 outputs a signal, the frequency of the signal output from the frequency divider 211 in the local oscillator 21 decreases when it is higher than the frequency of the signal output from the frequency divider 207, but increases when it is lower than the latter frequency. The frequency of the signal output from the frequency divider 211 is substantially equal to 1/N of the frequency of the first local oscillation signal. The frequency of the signal output from the frequency divider 207 is substantially equal to 1/M of the sum of (or the difference between) the frequency of the second local oscillation signal and the offset frequency.

Therefore, the frequency of the first local oscillation signal converges to N/M of the sum of (or the difference between) the frequency of the second local oscillation signal and the offset frequency. The frequency of the carrier component of the FM modulation signal which is included in each of the I channel base band signal and the Q channel base band signal converges to a value substantially equal to the offset frequency.

The mixer 8I generates a signal representing that component in the product of the signal supplied from the DC eliminating section 7I and the second local oscillation signal whose frequency is substantially equal to the sum of (or the difference between) those two signals, and sends the signal to the adder 12. The mixer 8Q generates a signal representing that component in the product of the signal supplied from the DC eliminating section 7Q and the second phase signal whose frequency is substantially equal to the sum of (or the difference between) those two signals, and sends the signal to the adder 12. The second local oscillation signal that is supplied to the mixer 8I and the phase shifter 10 is supplied from the oscillator 202 in the local oscillator 21.

The adder 12 produces a signal representing the sum of the signals supplied from the mixers 8I and 8Q. This signal is filtered by the BPF 13 to be an IF signal which is in turn amplified by the IF amplifier 14. The frequency of the carrier component of the FM modulation signal which is included in the IF signal converges to a value substantially equal to the sum of (or the difference between) the frequency of the second local oscillation signal and the offset frequency.

The IF signal amplified by the IF amplifier 14 is subjected to FM demodulation in the FM detector 15. The AF signal that is yielded by the demodulation is output as the output signal of the FM receiver 200 and is reproduced.

Through the above-described operation, the FM modulation signal received by the FM receiver 200 is demodulated and a speech represented by the AF signal is reproduced.

This FM receiver 200 demodulates an FM modulation signal using the direct conversion scheme. The first local oscillation signal is generated based on the carrier component of the FM modulation signal that is extracted from the Q channel base band signal. Therefore, the frequency of the first local oscillation signal becomes stable, thus stabilizing the demodulation operation of the FM receiver 200. Further, the structure of the FM receiver 200 becomes simple and easy to adjust.

The structures of the FM receivers according to the embodiments of the invention are not limited to those described above.

For example, in both the FM receivers 100 and 200, the branching filter 3 may comprise an A/D (Analog-to-Digital) converter and a DSP (Digital Signal Processor) or a CPU (Central Processing Unit), or the FM detector 15 may comprise a DSP or CPU and a D/A (Digital-to-Analog) converter. A part or all of the functions of the other components of the FM receiver 100 or 200 may be accomplished by a DSP or CPU.

The FM receivers 100 and 200 need not acquire an FM modulation signal from the antenna 1. The FM receivers 100 and 200 may obtain an FM modulation signal over, for example, a cable. Further, the RF amplifier 2 may be omitted.

The FM receivers 100 and 200 may demodulate a PM (Phase Modulation) modulation signal. In this case, the FM detector 15 may include an integration circuit or the like which integrates an AF signal obtained by FM demodulation of an IF signal.

The frequency dividing ratios p, q, r, s and t can take arbitrary values as long as they satisfy the aforementioned relationships. Therefore, at least one of the frequency dividers 102, 105, 106, 107 and 112 may be so designed as to be able to change its frequency dividing ratio. For example, the frequency divider 112 may have such a structure that its frequency dividing ratio is changeable in accordance with the manipulation by an operator. With the frequency divider 112 having such a design, the FM receiver 100 can change the carrier frequency of an FM modulation signal to be received.

Likewise, the frequency dividing ratios M and N can take arbitrary values as long as they satisfy the aforementioned relationships. Therefore, at least one of the frequency dividers 207 and 211 may have such a structure as to be able to change its frequency dividing ratio in response to the manipulation by an operator. If the frequency dividing ratio of the frequency divider 211 is made variable, the FM receiver 100 can change the carrier frequency of an FM modulation signal to be received.

The local oscillator 21 of the FM receiver 200 may be supplied with the I channel base band signal from the DC eliminating section 7I instead of the Q channel base band signal from the DC eliminating section 7Q.

The Q channel base band signal or the I channel base band signal that is supplied to the local oscillator 21 should not necessary be the one from which the DC component has been eliminated. Therefore, the local oscillator 21 may receive the Q channel base band signal from the LPF 5Q or the AF amplifier 6Q instead of the DC eliminating section 7Q, or may receive the I channel base band signal from the LPF 5I or the AF amplifier 6I instead of the DC eliminating section 7I.

Although the angle demodulation apparatus and angle demodulation method according to the invention have been described, the angle demodulation apparatus of the invention can be realized by an ordinary computer system, not by a special system. For example, the FM receiver 100 or FM receiver 200 which executes the above-described processes can be achieved by installing a program which executes the above-described operation into a personal computer having an A/D converter and D/A converter from a medium (floppy disk, CD-ROM or the like) in which the program is stored.

Further, this program may be put on a BBS (Bulletin Board System) of a communications network and distributed over the network. The distribution over a network may be carried out by transferring a modulation signal acquired by modulating the program with a carrier wave.

As the program is activated and run in the same way as other application programs under the control of an OS, the above-described processes can be executed.

When the OS performs a part of the processes, or when the OS constitutes a part of a single structural element of the invention, a program excluding that part may be stored in a recording medium. It is assumed in this case too that a program for executing the individual functions or steps that the computer execute is stored in the recording medium according to the invention.

As described above, the invention provides an angle demodulation apparatus and angle demodulation method which execute the direct conversion scheme, have a simple structure and are easy to adjust.

The invention also provides an angle demodulation apparatus and angle demodulation method which generate local oscillation signals based on a single reference oscillation signal and employ the direct conversion scheme.

The invention further provides a local oscillation apparatus and local oscillation generating method which generate local oscillation signals based on a single reference oscillation signal.

Furthermore, the invention provides an angle demodulation apparatus and angle demodulation method which generate local oscillation signals with stable frequencies and execute stable demodulation using the direct conversion scheme.

This patent application claims the priority of Japanese Patent Application No. 2000-232024 filed at the Japanese Patent Office on Jul. 31, 2000, and Japanese Patent Application No. 2000-358845 filed at the Japanese Patent Office on Nov. 27, 2000, which are incorporated herein by reference.

What is claimed is:

1. An angle demodulation apparatus comprising:
   a first oscillation section for generating a first local oscillation signal and a first phase signal whose phase differs from that of said first local oscillation signal substantially by 90 degrees;
   a first mixing section for externally receiving an angle modulation signal, receiving said first local oscillation signal and said first phase signal from said first oscillation section, generating a first base band signal representing a product of an instantaneous value of said angle modulation signal and an instantaneous value of said first local oscillation signal from which a component with a frequency of substantially 0 is removed, and generating a second base band signal representing a product of said instantaneous value of said angle modulation signal and an instantaneous value of said first phase signal from which a component with a frequency of substantially 0 is removed;
   a second oscillation section for generating (i) a second local oscillation signal whose frequency is substantially equal to a difference between or a sum of a predetermined intermediate frequency signal and an offset frequency of a predetermined range, and (ii) a second phase signal whose phase differs from that of said second local oscillation signal substantially by 90 degrees;
   a second mixing section for receiving said first and second base band signals from said first mixing section, receiving said second local oscillation signal and said second phase signal from said second oscillation section, and generating an intermediate frequency signal representing a sum of or a difference between: (i) a product of an instantaneous value of said first base band signal and an instantaneous value of said second local oscillation signal and (ii) a product of an instantaneous value of said second base band signal and an instantaneous value of said second phase signal; and
   a demodulation section for receiving said intermediate frequency signal from said second mixing section and demodulating said intermediate frequency signal to thereby generate an angle demodulation signal;
   wherein said first oscillation section generates said first local oscillation signal, whose frequency is substantially equal to a sum of or a difference between a carrier frequency of said angle modulation signal and said offset frequency, by receiving said first base band signal or said second base band signal from said first mixing section, extracting a carrier component of said angle modulation signal included in said received first base band signal or second base band signal and generating a signal whose frequency converges to a frequency having a given ratio to a frequency of said extracted carrier component.

2. The angle demodulation apparatus according to claim 1, wherein said first oscillation section includes:
   a third mixing section for receiving said first base band signal or said second base band signal from said first mixing section, receiving said second local oscillation signal from said second oscillation section, and generating a signal representing a product of an instantaneous value of said carrier component of said angle modulation signal included in said received first base band signal or second base band signal and said instantaneous value of said second local oscillation signal;
   a carrier-component extracting section for extracting, from said signal generated by said third mixing section, said carrier component, whose frequency is equivalent to a sum of or a difference between said carrier frequency of said angle modulation signal and said frequency of said second local oscillation signal; and
   a variable frequency oscillator for generating said first local oscillation signal, whose frequency is substantially equal to said sum of or said difference between said carrier frequency of said angle modulation signal and said offset frequency, by generating said signal whose frequency converges to said frequency having said given ratio to said frequency of said carrier component extracted by said carrier-component extracting section.

3. The angle demodulation apparatus according to claim 2, wherein said variable frequency oscillator has a PLL (Phase-Locked Loop) control section for determining said frequency of said first local oscillation signal, based on a phase difference between: (i) a signal acquired by frequency-dividing said carrier component, extracted by said carrier-component extracting section, by a predetermined first frequency dividing ratio and (ii) a signal acquired by frequency-dividing said first local oscillation signal by a predetermined second frequency dividing ratio, in such a way that said frequency of said first local oscillation signal converges to a value having said given ratio to said frequency of said carrier component extracted by said carrier-component extracting section, and generating said first local oscillation signal having said determined frequency.

4. The angle demodulation apparatus according to claim 1, wherein said first oscillation section includes:
   a carrier-component extracting section for receiving said first base band signal or said second base band signal from said first mixing section and extracting said carrier component of said angle modulation signal from said received first base band signal or second base band signal;
   a third mixing section for receiving said second local oscillation signal from said second oscillation section, generating a signal representing a product of an instantaneous value of said carrier component extracted by said carrier-component extracting section and said instantaneous value of said second local oscillation signal, and extracting, from the generated signal, a component whose frequency is equivalent to a sum of or a difference between said carrier frequency of said angle modulation signal and said frequency of said second local oscillation signal; and
   a variable frequency oscillator for generating said first local oscillation signal, whose frequency is substantially equal to said sum of or said difference between said carrier frequency of said angle modulation signal and said offset frequency, by generating a signal whose frequency converges to a frequency having a given ratio to said frequency of said component extracted by said third mixing section.

5. The angle demodulation apparatus according to claim 4, wherein said variable frequency oscillator has a PLL (Phase-Locked Loop) control section for determining said frequency of said first local oscillation signal, based on a phase difference between: (i) a signal acquired by frequency-dividing said carrier component, extracted by said third mixing section, by a predetermined first frequency dividing ratio and (ii) a signal acquired by frequency-dividing said first local oscillation signal by a predetermined second frequency dividing ratio, in such a way that said frequency of said first local oscillation signal converges to a value having a given ratio to said frequency of said carrier component extracted by said carrier-component extracting section, and generating said first local oscillation signal having said determined frequency.

6. The angle demodulation apparatus according to claim 5, wherein said offset frequency lies within a range of 300 Hz.

7. A method for an angle demodulation apparatus comprising:
   generating, using a first oscillation section of the apparatus, a first local oscillation signal and a first phase signal whose phase differs from that of said first local oscillation signal substantially by 90 degrees;
   externally receiving an angle modulation signal, generating a first base band signal representing a product of an instantaneous value of said angle modulation signal and an instantaneous value of said first local oscillation signal from which a component with a frequency of substantially 0 is removed, and generating a second base band signal representing a product of said instantaneous value of said angle modulation signal and an instantaneous value of said first phase signal from which a component with a frequency of substantially 0 is removed;
   generating, using a second oscillation section of the apparatus, (i) a second local oscillation signal whose frequency is substantially equal to a difference between or a sum of a predetermined intermediate frequency signal and an offset frequency of a predetermined range, and (ii) a second phase signal whose phase differs from that of said second local oscillation signal substantially by 90 degrees;
   generating an intermediate frequency signal representing a sum of or a difference between: (i) a product of an instantaneous value of said first base band signal and an instantaneous value of said second local oscillation signal and (ii) a product of an instantaneous value of said second base band signal and an instantaneous value of said second phase signal; and
   generating an angle demodulation signal by demodulating said intermediate frequency signal;
   wherein said first local oscillation signal has a frequency substantially equal to a sum of or a difference between a carrier frequency of said angle modulation signal and said offset frequency and is generated by extracting a carrier component of said angle modulation signal included in said received first base band signal or second base band signal and generating a signal whose frequency converges to a frequency having a given ratio to a frequency of said extracted carrier component.

8. A computer readable recording medium having recorded thereon a program which, when activated and run, causes a computer to function as:
   a first oscillation section for generating a first local oscillation signal and a first phase signal whose phase differs from that of said first local oscillation signal substantially by 90 degrees;
   a first mixing section for externally receiving an angle modulation signal, receiving said first local oscillation signal and said first phase signal from said first oscillation section, generating a first base band signal representing a product of an instantaneous value of said angle modulation signal and an instantaneous value of said first local oscillation signal from which a component with a frequency of substantially 0 is removed, and generating a second base band signal representing a product of said instantaneous value of said angle modulation signal and an instantaneous value of said first phase signal from which a component with a frequency of substantially 0 is removed;
   a second oscillation section for generating (i) a second local oscillation signal whose frequency is substantially equal to a difference between or a sum of a predetermined intermediate frequency signal and an offset frequency of a predetermined range, and (ii) a second phase signal whose phase differs from that of said second local oscillation signal substantially by 90 degrees;
   a second mixing section for receiving said first and second base band signals from said first mixing section, receiving said second local oscillation signal and said second phase signal from said second oscillation section, and generating an intermediate frequency signal representing a sum of or a difference between: (i) a product of an instantaneous value of said first base band signal and an instantaneous value of said second local oscillation signal and (ii) a product of an instantaneous value of said second base band signal and an instantaneous value of said second phase signal; and
   a demodulation section for receiving said intermediate frequency signal from said second mixing section and demodulating said intermediate frequency signal to thereby generate an angle demodulation signal;
   wherein said first oscillation section generates said first local oscillation signal, whose frequency is substantially equal to a sum of or a difference between a carrier frequency of said angle modulation signal and said offset frequency, by receiving said first base band signal or said second base band signal from said first mixing section, extracting a carrier component of said angle modulation signal included in said received first base band signal or second base band signal and generating a signal whose frequency converges to a frequency having a given ratio to a frequency of said extracted carrier component.

* * * * *